United States Patent
Iwata et al.

(10) Patent No.: US 9,502,793 B2
(45) Date of Patent: Nov. 22, 2016

(54) ASSEMBLY STRUCTURE OF ELECTRICAL JUNCTION BOX

(75) Inventors: Masashi Iwata, Makinohara (JP); Mami Nohara, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 213 days.

(21) Appl. No.: 13/642,899

(22) PCT Filed: Apr. 27, 2011

(86) PCT No.: PCT/JP2011/002488
§ 371 (c)(1),
(2), (4) Date: Oct. 23, 2012

(87) PCT Pub. No.: WO2011/135861
PCT Pub. Date: Nov. 3, 2011

(65) Prior Publication Data
US 2013/0037317 A1     Feb. 14, 2013

(30) Foreign Application Priority Data
Apr. 30, 2010     (JP) .................................. 2010-105045

(51) Int. Cl.
*H01J 5/00* (2006.01)
*H01R 9/22* (2006.01)
(Continued)

(52) U.S. Cl.
CPC ............ *H01R 9/223* (2013.01); *H05K 5/0026* (2013.01); *H05K 7/026* (2013.01)

(58) Field of Classification Search
CPC ..................... H05K 7/026; H05K 5/00; H05K 5/0026; B60R 16/0238; B60R
(Continued)

(56) References Cited

U.S. PATENT DOCUMENTS 5,676,552 A     10/1997  Fukuda et al.
6,322,376 B1 *  11/2001  Jetton .......................... 439/76.2
(Continued)

FOREIGN PATENT DOCUMENTS

CN     1848569 A     10/2006
CN   101312287 A     11/2008
(Continued)

OTHER PUBLICATIONS

Korean Office Action issued Sep. 17, 2013 in a corresponding Korean Patent Application No. 10-2012-7027144.
(Continued)

*Primary Examiner* — Angel R Estrada
*Assistant Examiner* — Pete Lee
(74) *Attorney, Agent, or Firm* — Sughrue Mion, PLLC

(57) ABSTRACT

Provided is an assembly structure of an electrical junction box which makes it possible to fit an electrical component attachment block into an insulation case without provision of a lock mechanism. Included are a housing (15) provided in an insulation case (5) and configured to house an electrical component attachment block (7); contact walls (19, 20) provided in an inner wall of the housing (15), and configured to come into contact with the housed electrical component attachment block (7); a terminal receiving portion (23) provided to the insulation case (5), on which to place a connection terminal (8); and a fastening module (9) configure to screw-fix the connection terminal (8) placed on the terminal receiving portion (23) to a conduction bus bar (37) in the electrical component attachment block (7) housed in the housing (15). The electrical component attachment block (7) is fitted into the insulation case (5) by fixing the connection terminal (8) to the conductor bus bar (37) by use of the fastening module (9) with the electrical component
(Continued)

attachment block (7) put in contact with the contact walls (19, 20).

5 Claims, 13 Drawing Sheets

(51) Int. Cl.
*H05K 5/00* (2006.01)
*H05K 7/02* (2006.01)

(58) Field of Classification Search
CPC .................. 16/0239;H01R 2201/26; H01R 12/716; H01R 12/724; H01R 13/5213; H01R 9/226; H01R 13/6666; H01R 13/684; H01R 13/688; H01R 9/223; H02G 3/08; H01H 2085/0034; H01H 2085/2075; H01H 2085/2085; H01H 85/0026; H01H 85/003; H01H 85/045; H01H 85/165; H01H 85/17; H01H 85/175; H01H 85/1755; H01H 85/18; H01H 85/185; H01H 85/20; H01H 85/2045; H01H 85/22; H01H 85/26
USPC .................. 439/76.2, 92, 620.26, 620.27
See application file for complete search history.

(56) References Cited

U.S. PATENT DOCUMENTS

| | | | | |
|---|---|---|---|---|
| 6,759,938 B2* | 7/2004 | Matsumura | .......... | H01H 85/044 337/161 |
| 7,499,262 B1* | 3/2009 | Darr | ........ | H01R 9/226 361/626 |
| 7,563,109 B2* | 7/2009 | Kanamaru | ............ | H05K 7/026 439/701 |
| 7,568,921 B2* | 8/2009 | Pavlovic et al. | ............ | 439/76.2 |
| 7,850,462 B2* | 12/2010 | Nakagawa | ................... | 439/76.2 |
| 2005/0116807 A1 | 6/2005 | Nojima et al. | | |
| 2005/0285709 A1* | 12/2005 | Matsumura et al. | ......... | 337/227 |
| 2006/0154532 A1* | 7/2006 | Yamada et al. | ............... | 439/701 |
| 2006/0258185 A1 | 11/2006 | Yagi et al. | | |
| 2008/0169126 A1 | 7/2008 | Kanamaru et al. | | |
| 2008/0200045 A1 | 8/2008 | Akahori et al. | | |

FOREIGN PATENT DOCUMENTS

| | | |
|---|---|---|
| CN | 101350509 A | 1/2009 |
| JP | 3106287 B2 | 11/2000 |
| JP | 2001-203010 A | 7/2001 |
| JP | 2006-180598 A | 7/2006 |
| JP | 2006-296172 A | 10/2006 |
| JP | 2008-178167 A | 7/2008 |
| JP | 2010-063268 A | 3/2010 |

OTHER PUBLICATIONS

International Search Report for PCT/JP2011/02488 dated Jul. 29, 2011.
Japanese Office Action issued Feb. 25, 2014 in a corresponding Japanese Patent Application No. 2010-105045.
Communication dated Jul. 21, 2014, issued by the State Intellectual Property Office of the People's Republic of China in corresponding Application No. 201180021859.5.

* cited by examiner

ASSEMBLY STRUCTURE OF ELECTRICAL JUNCTION BOX

TECHNICAL FIELD

The present invention relates to an assembly structure of an electrical junction box to be used for electrically connecting an in-vehicle battery to various in-vehicle loads.

BACKGROUND ART

FIG. 1 shows a conventional electrical junction box 100 recited in Patent Document 1, for example, which is formed by assembling an insulation case 110 and an electrical component attachment block 120 together.

The insulation case 110 includes a housing 130 for housing the electrical component attachment block 120. A top and a bottom of the housing 130 are open, and the electrical component attachment block can 120 be inserted from either of upper and lower directions. First lock protrusions 140 and second lock protrusions 150 are formed on inner walls of the housing 130, and are configured to engage with the electrical component attachment block 120.

The electrical component attachment block 120 includes a block main body 180 inside which a conductor bus bar (whose illustration is omitted) is provided. The electrical component attachment block 120 electrically connects a power source to in-vehicle loads via the conductor bus bar. First lock arms 160 and second lock arms 170 are formed on outer surfaces of the block main body 180. The first lock arms 160 correspond to the first lock protrusions 140 on the insulation case 110, while the second lock arms 170 correspond to the second lock protrusions 150 on the insulation case 110. The first lock arms 160 are configured to engage with the first lock protrusions 140 when the electrical component attachment block 120 is inserted from above into the insulation case 110, while the second lock arms 170 are configured to engage with the second lock protrusions 150 when the electrical component attachment block 120 is inserted from below into the insulation case 110. That is to say, the first lock protrusions 140, the second lock protrusions 150, the first lock arms 160, and the second lock arms 170 collectively constitute a lock mechanism for assembling the electrical junction box 100.

CITATION LIST

Patent Literature

[Patent Literature 1] Japanese Patent Application Laid-Open No. 2008-178167

SUMMARY OF INVENTION

Technical Problem

In the conventional structure, the insulation case 110 and the electrical component attachment block 120 need to be provided with the lock mechanism including the lock protrusions 140, 150 and the lock arms 160, 170 configured to engage with each other, respectively. In the case where the lock mechanism is formed on the insulation case 110 and the electrical component attachment block 120 as described above, structures of molds for forming the insulation case 110 and the electrical component attachment block 120 are complicated. Moreover, contours and weights of the insulation case 110 and the electrical component attachment block 120 increase by an amount needed for providing the lock mechanism including the lock protrusions 140, 150 and the lock arms 160, 170.

With this taken into consideration, an object of the present invention is to provide an assembly structure of an electrical junction box which enables the assembling of an insulation case and an electrical component attachment block together without having a lock mechanism provided, and thereby suppresses complication of molds and increase in contours and weights.

Solution to Problem

An assembly structure of an electrical junction box of a first aspect of the present invention is an assembly structure of an electrical junction box including: an electrical junction box having an insulation case and an electrical component attachment block to be fixed to this insulation case; and a connection terminal configured to be fitted to the electrical component attachment block fitted into the insulation case, and to be connected to a conductor bus bar in the electrical component attachment block. The assembly structure of an electrical junction box is characterized by including: a housing provided in the insulation case, and configured to house the electrical component attachment block; a contact wall provided on an inner wall of the housing, with which to put the housed electrical component attachment block in contact; a terminal receiving portion provided on the insulation case, on which to place the connection terminal; and a fastening module configured to screw-fix the connection terminal placed on the terminal receiving portion to the conductor bus bar in the electrical component attachment block housed in the housing. The assembly structure of an electrical junction box is further characterized in that the electrical component attachment block is fitted into the insulation case by fixing the connection terminal to the conductor bus bar by use of the fastening module with the electrical component attachment block put in contact with the contact wall.

A second aspect of the present invention is the assembly structure of an electrical junction box of the first aspect of the present invention, characterized in that: the housing includes a one-side opening over which the contact wall is formed, and an opposite-side opening through which to insert the electrical component attachment block into the housing; the fastening module includes a connection bolt installed upright from the electrical component attachment block and configured to protrude from the one-side opening when the electrical component attachment block is housed in the housing 15, and a faster nut configured to be screwed onto the connection bolt; and the connection terminal includes a contact plate portion to be joined to the conductor bus bar, and a bolt insertion hole provided in the contact plate portion, in which to insert the connection bolt.

A third aspect of the present invention is the assembly structure of an electrical junction box of the second aspect of the present invention, characterized in that: the electrical component attachment block includes a block main body, as well as the conductive bus bar including a load side terminal connection module, a power source side terminal connection module, a load side terminal portion provided to the load side terminal connection module, and a power source side terminal portion provided to the power source side terminal connection module; contact projecting portions configured to come in contact with the contact wall are formed in locations on the block main body which are close to four corners of the power source side terminal connection module, respectively; and the contact wall is provided protruding from an opening edge portion of the one-side opening toward the inside of the opening.

Advantageous Effect of Invention

According to the first aspect of the invention, the electrical component attachment block is fitted into the insulation case by screw-fixing the conductor bus bar in the electrical component attachment block to the connection terminal with the electrical component attachment block, which is housed in the insulation case, put in contact with the contact wall of the insulation case, and with the connection terminal placed on the terminal receiving portion of the insulation case.

This structure makes it no longer necessary to provide the insulation case and the electrical component attachment block with a lock mechanism for establishing a state of engagement between these constituents, because upward detachment of the electrical component attachment block is restricted by putting the electrical component attachment block in contact with the contact wall of the insulation case while downward detachment of the electrical component attachment block is restricted by placing the connection terminal on the terminal receiving portion of the insulating case. By this, molds for forming the insulation case and the electrical component attachment block are prevented from complication. Moreover, since no lock mechanism is required, it is possible to suppress increase in contours and weights of the insulation case and the electrical component attachment block.

According to the second aspect of the invention, in addition to the effect of the first aspect of the invention, it is possible to electrically connect the conductor bus bar of the electrical component attachment block to the connection terminal, and to simultaneously fit the electrical component attachment block into the insulation case, by inserting the connection bolt installed upright from the electrical component attachment block into the connection terminal and screwing the connection nut onto the connection bolt. Hence, it is possible to achieve assembly and electrical connection of the electrical junction box easily.

According to the third aspect of the invention, in addition to the effect of the second aspect of the invention, the contact projecting portions are surely capable of facing and contacting the contact wall even when the electrical component attachment block is turned over because: the four contact projecting portions are formed in the four locations on the block main body near the four corners of the power source side terminal connection module, respectively; and these contact projecting portions are configured to inevitably come into contact with the contact wall of the insulation case. Thereby, it is possible increase latitude in the placement direction of the electrical component attachment block for assembling.

DESCRIPTION OF EMBODIMENTS

Figure 1:
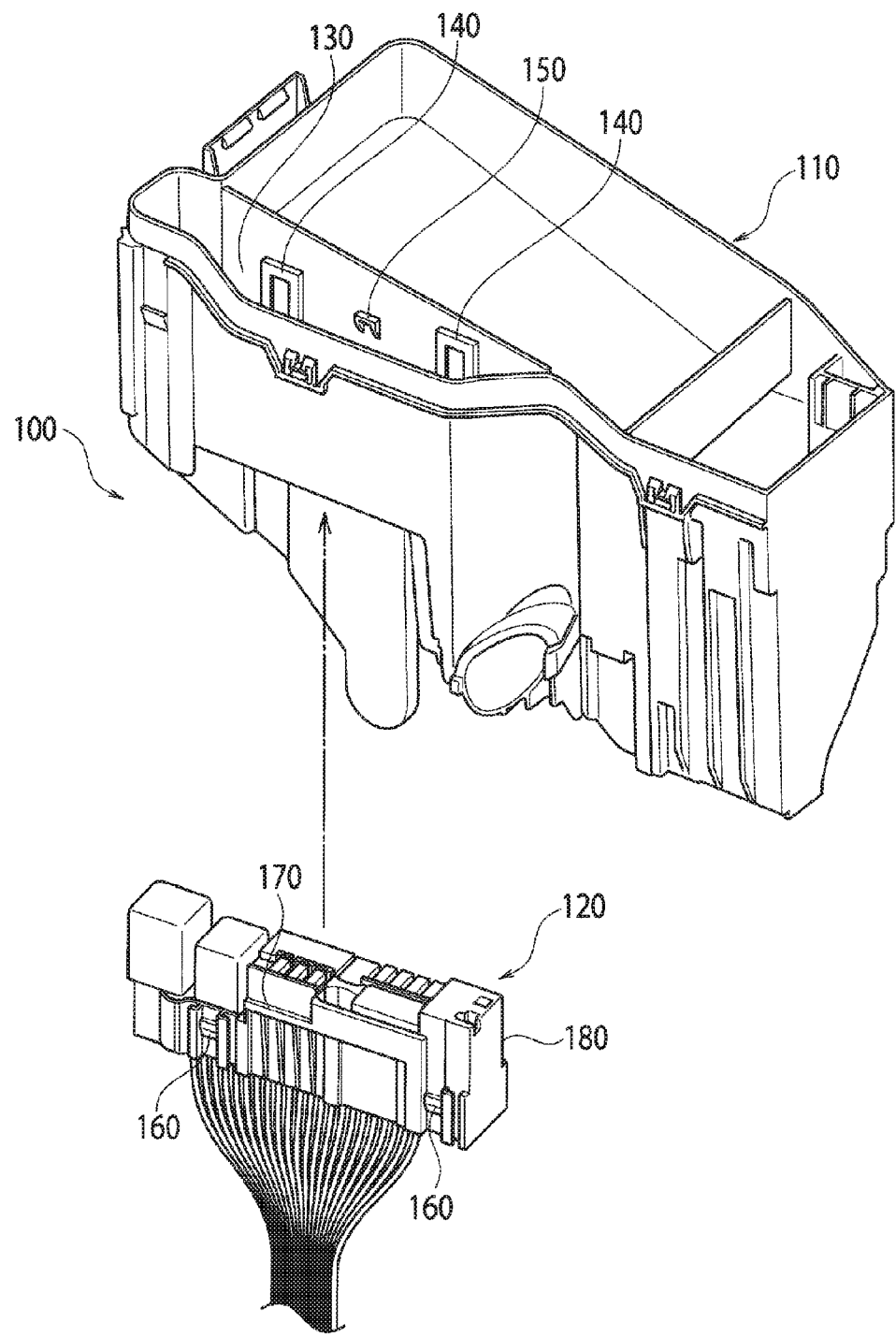
FIG. 1 is an exploded perspective view showing a conventional electrical junction box.
Figure 2:
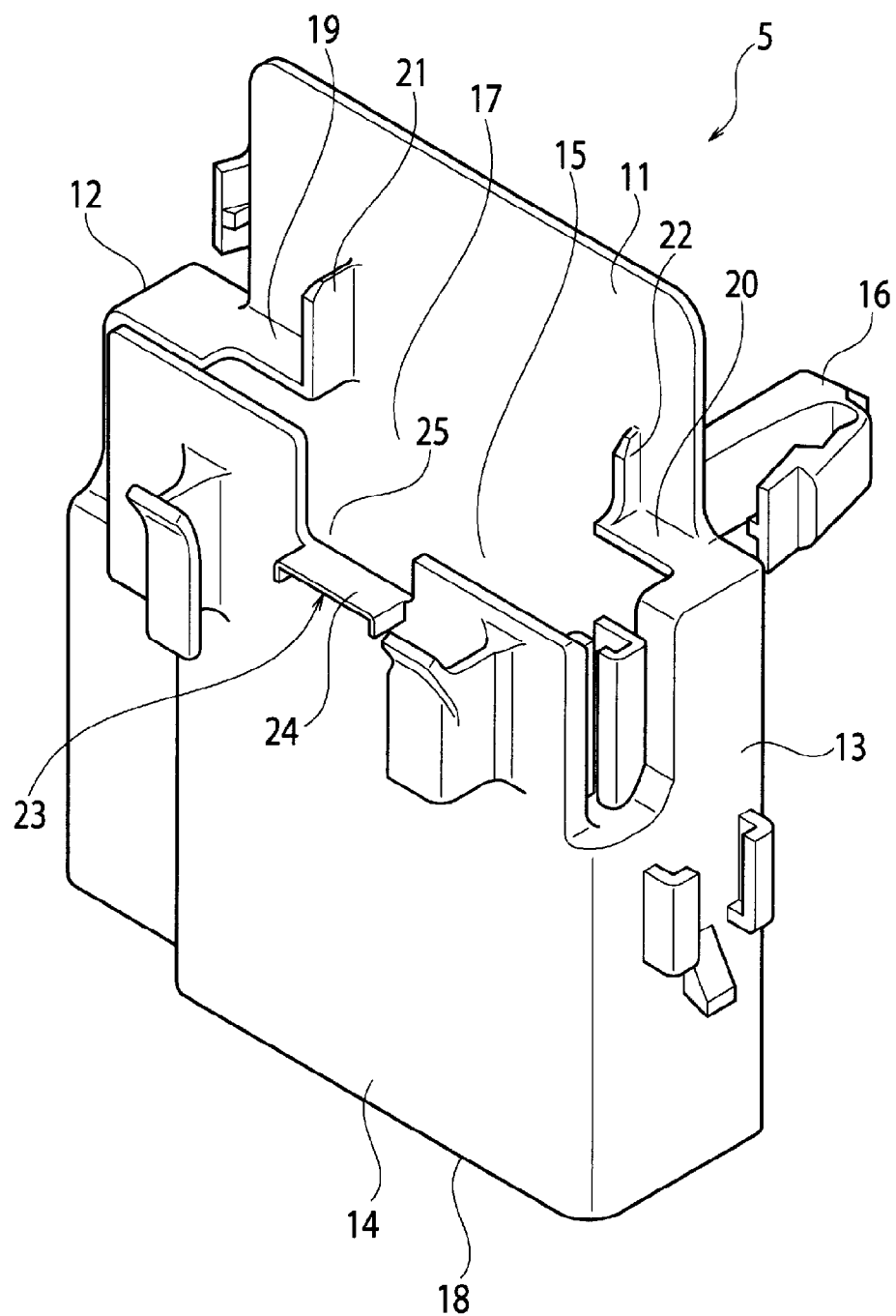
FIG. 2 is a perspective view of an insulation case used in an assembly structure of an embodiment of the present invention.
Figure 3:
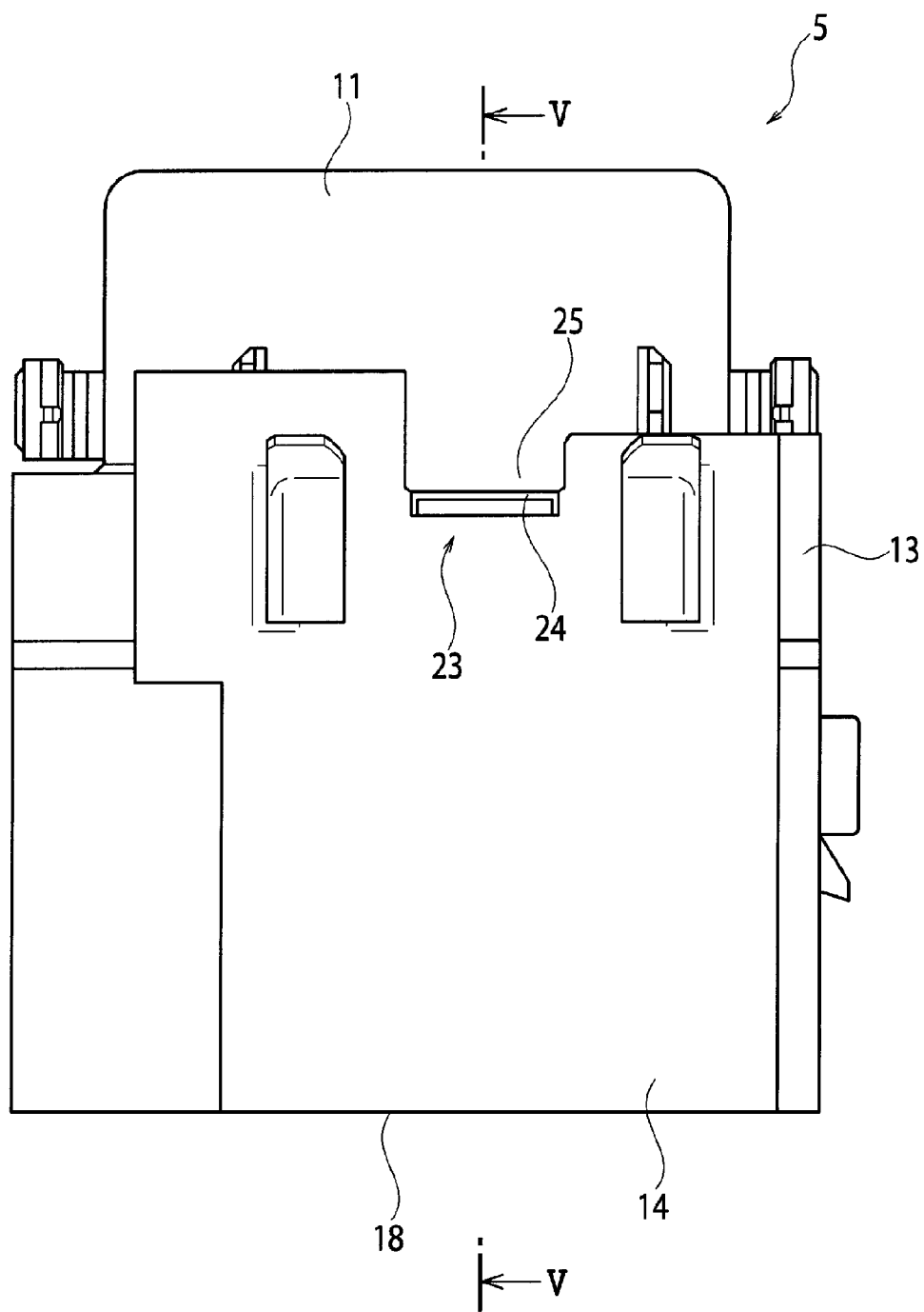
FIG. 3 is a front view of the insulation case.
Figure 4:
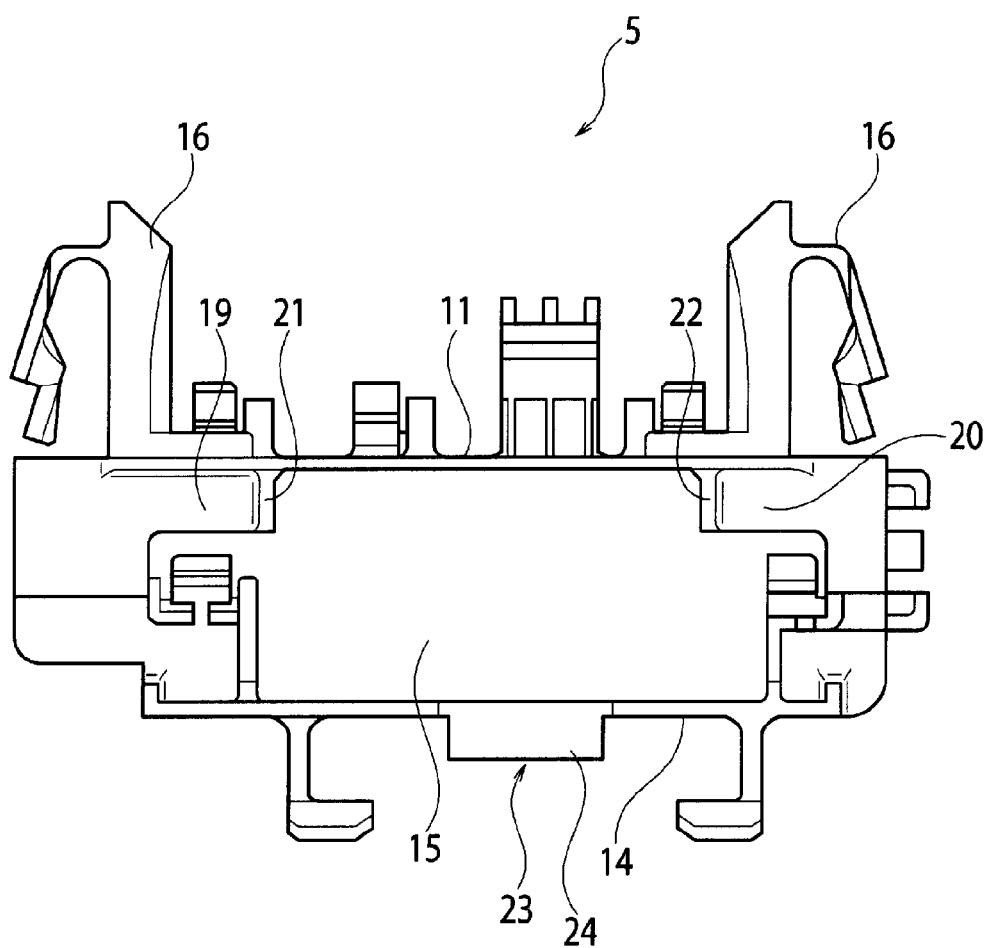
FIG. 4 is a plan view of the insulation case.
Figure 5:
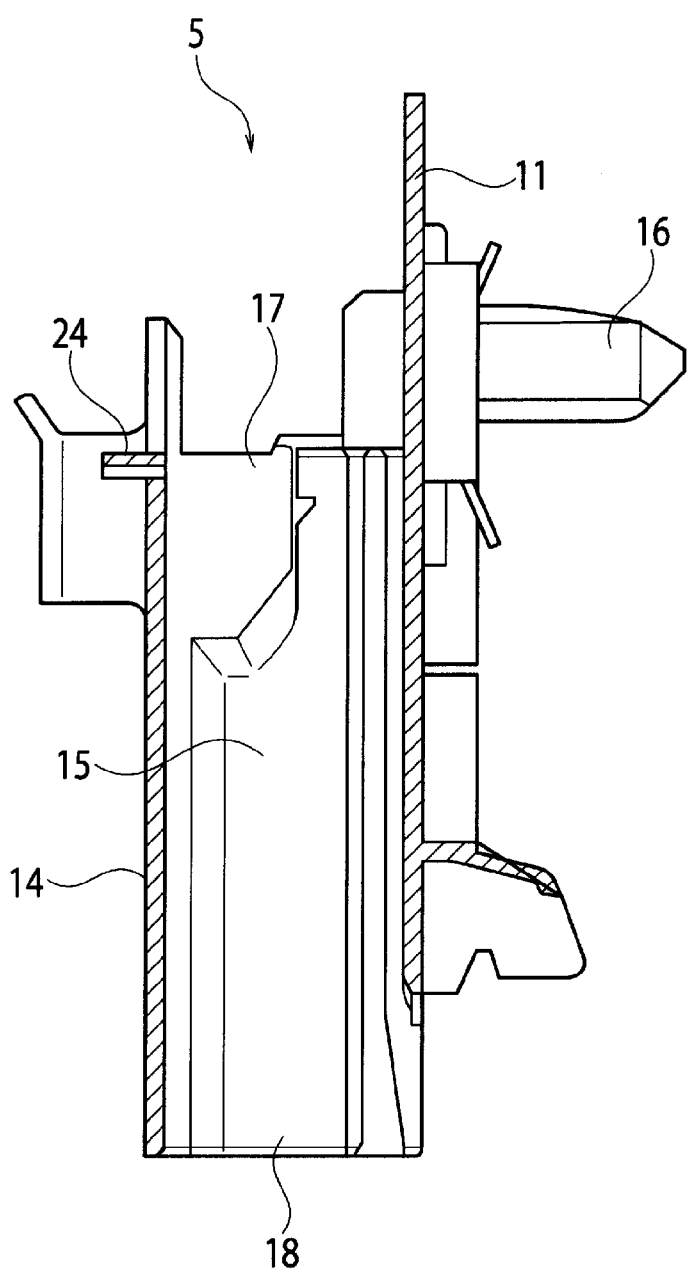
FIG. 5 is a cross-sectional view of the insulation case taken along a V-V line in FIG. 3.
Figure 6:
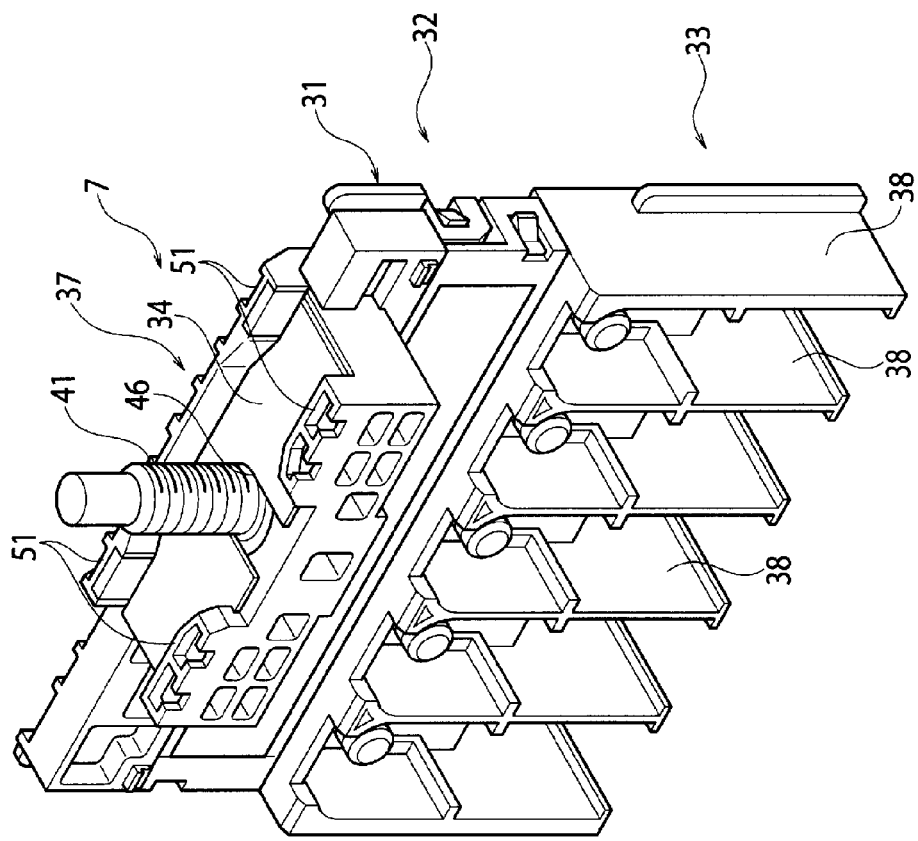
FIG. 6 is a perspective view of an electrical component attachment block used in the assembly structure of the embodiment of the present invention.
Figure 7:
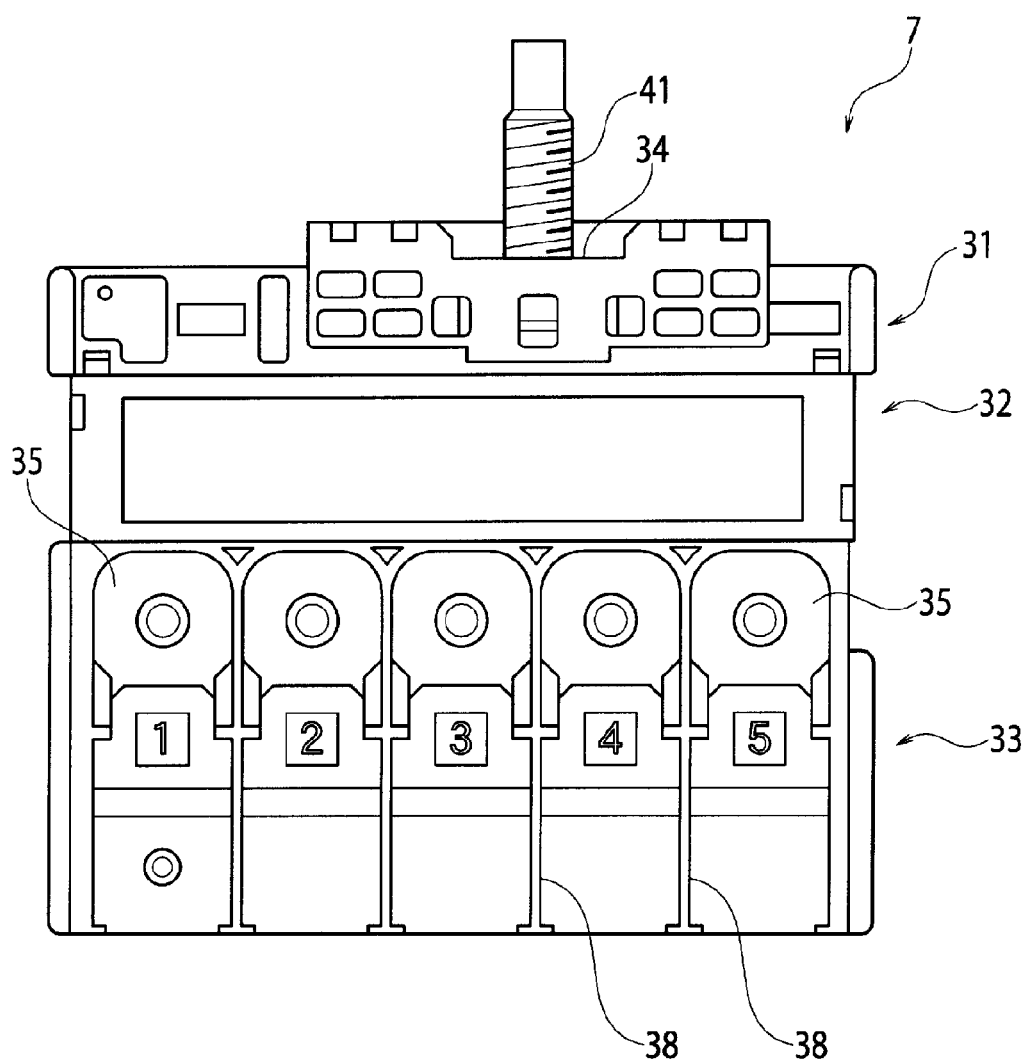
FIG. 7 is a front view of the electrical component attachment block.
Figure 8:
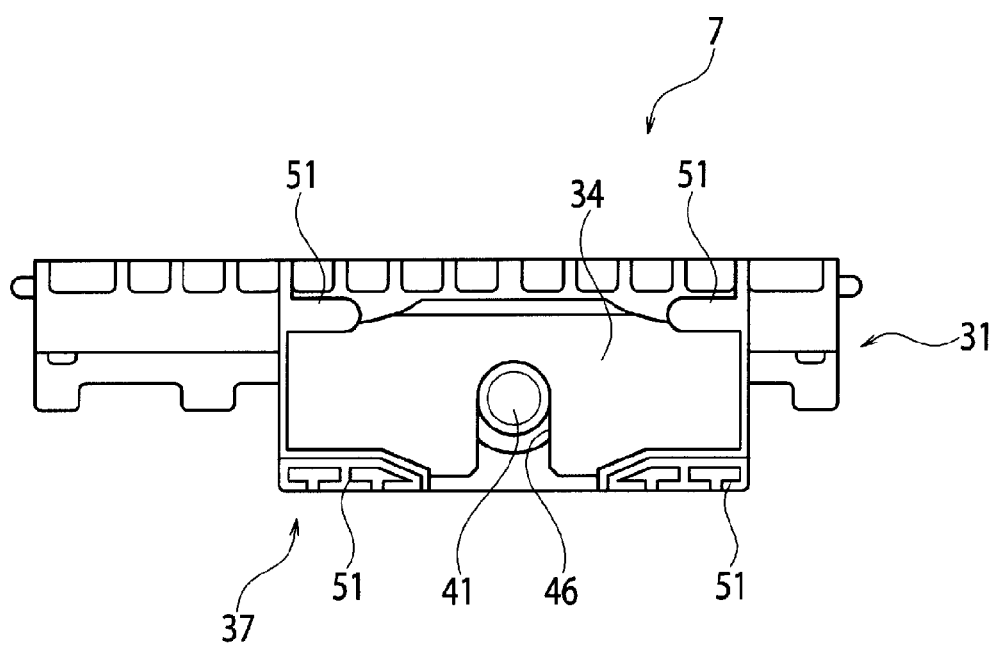
FIG. 8 is a plan view of the electrical component attachment block.
Figure 9:
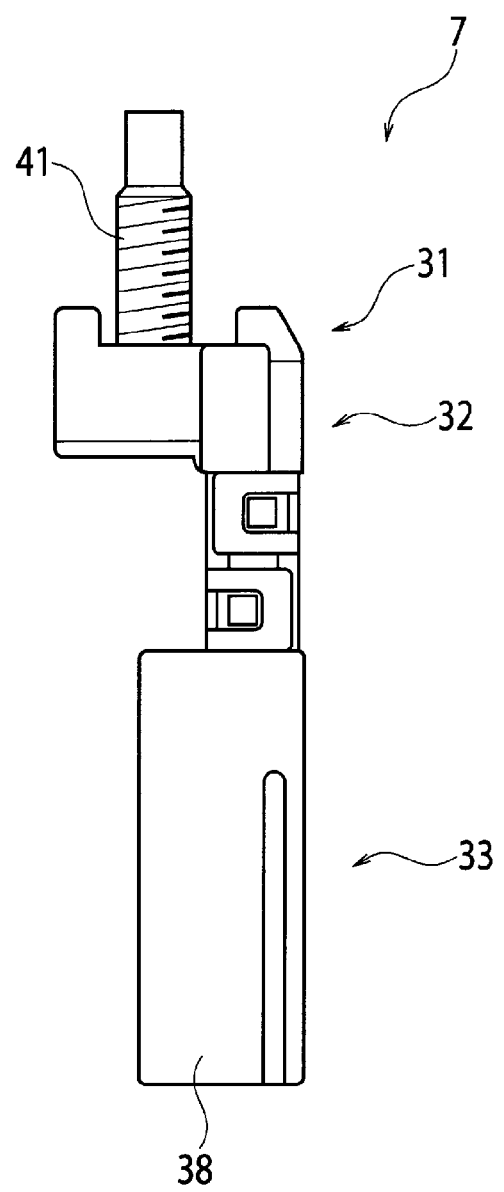
FIG. 9 is a right side view of the electrical component attachment block.
Figure 10:
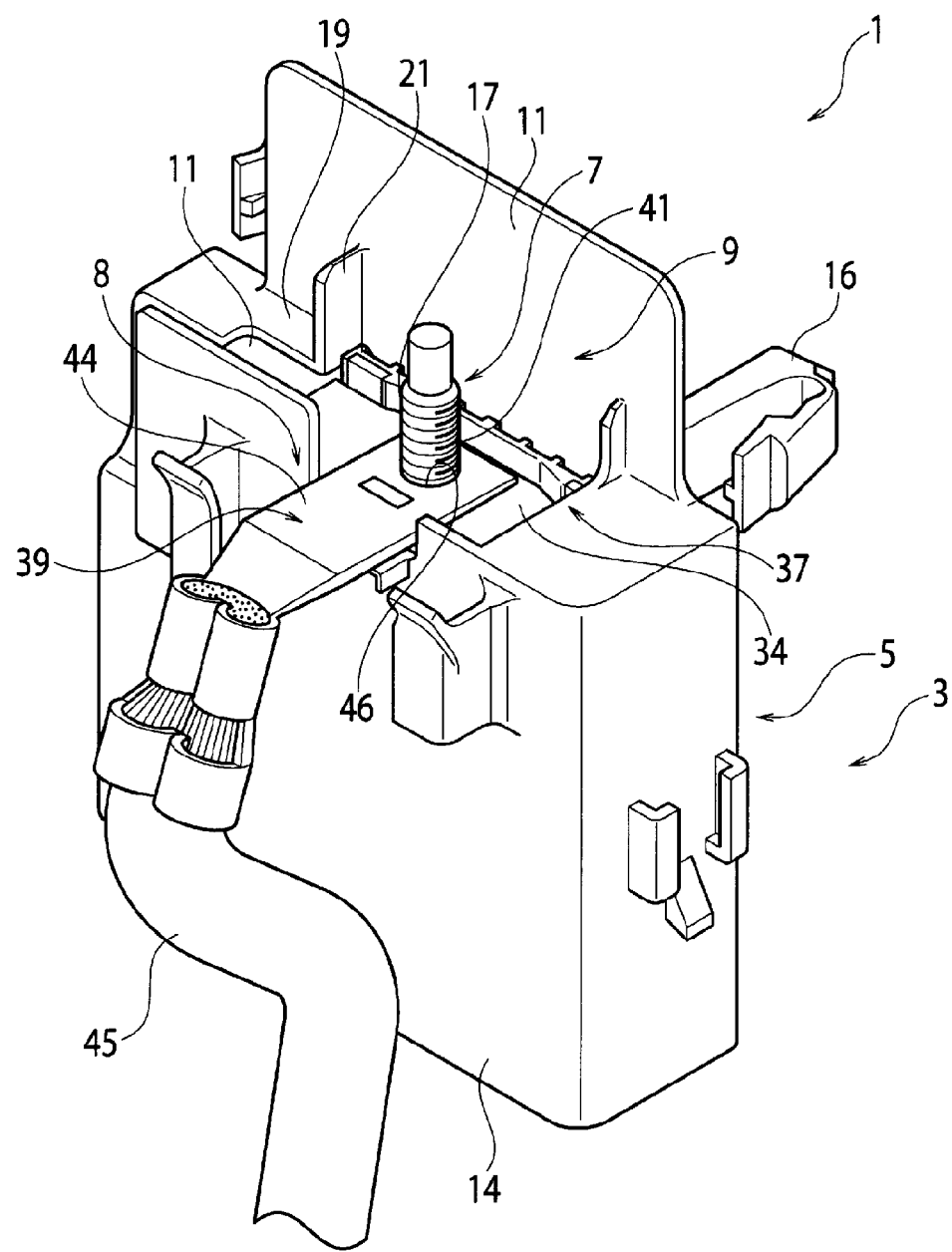
FIG. 10 is a perspective view showing the assembly structure of the embodiment of the present invention.
Figure 11:
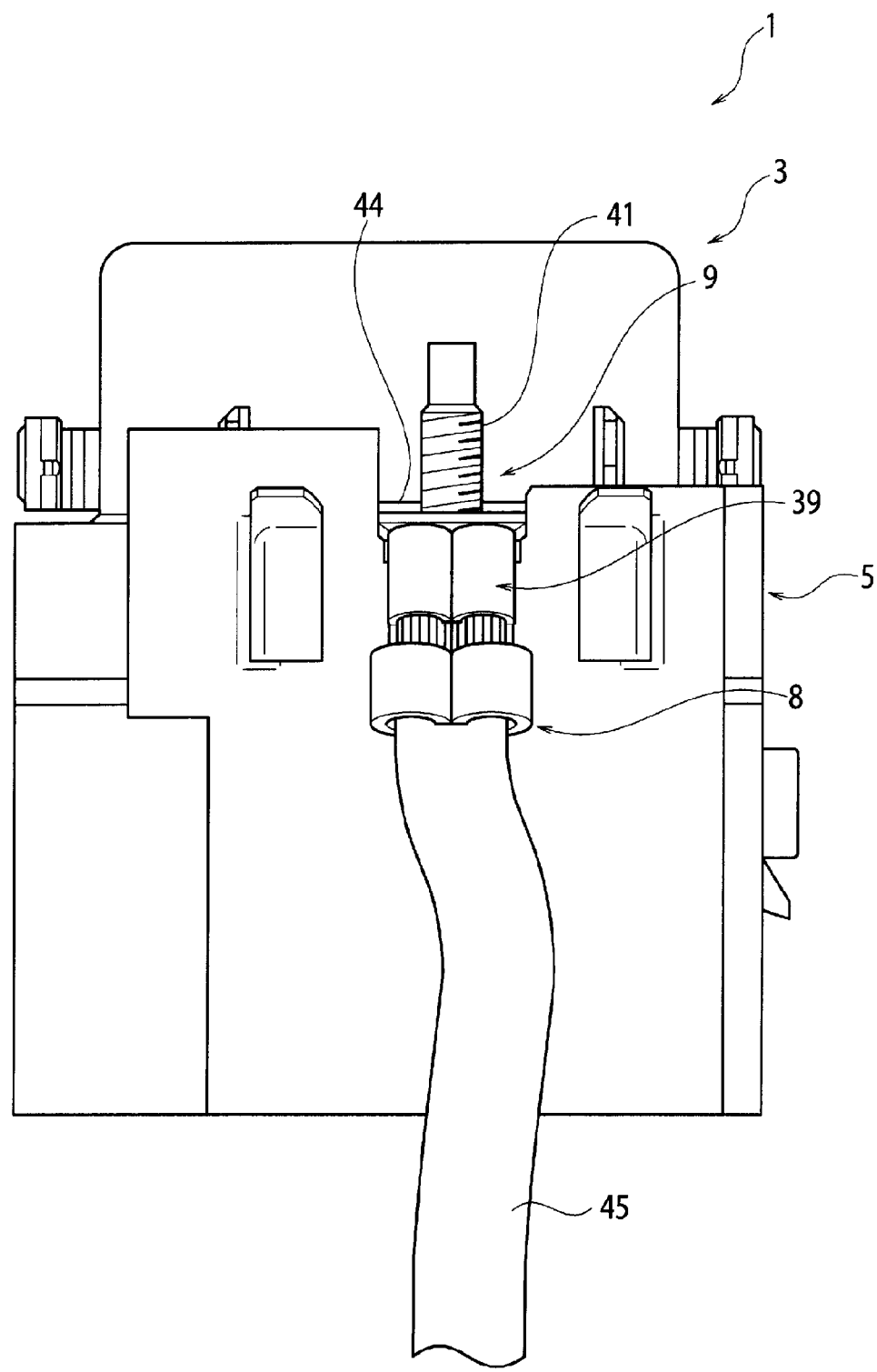
FIG. 11 is a front view of the assembly structure of the embodiment of the present invention.
Figure 12:
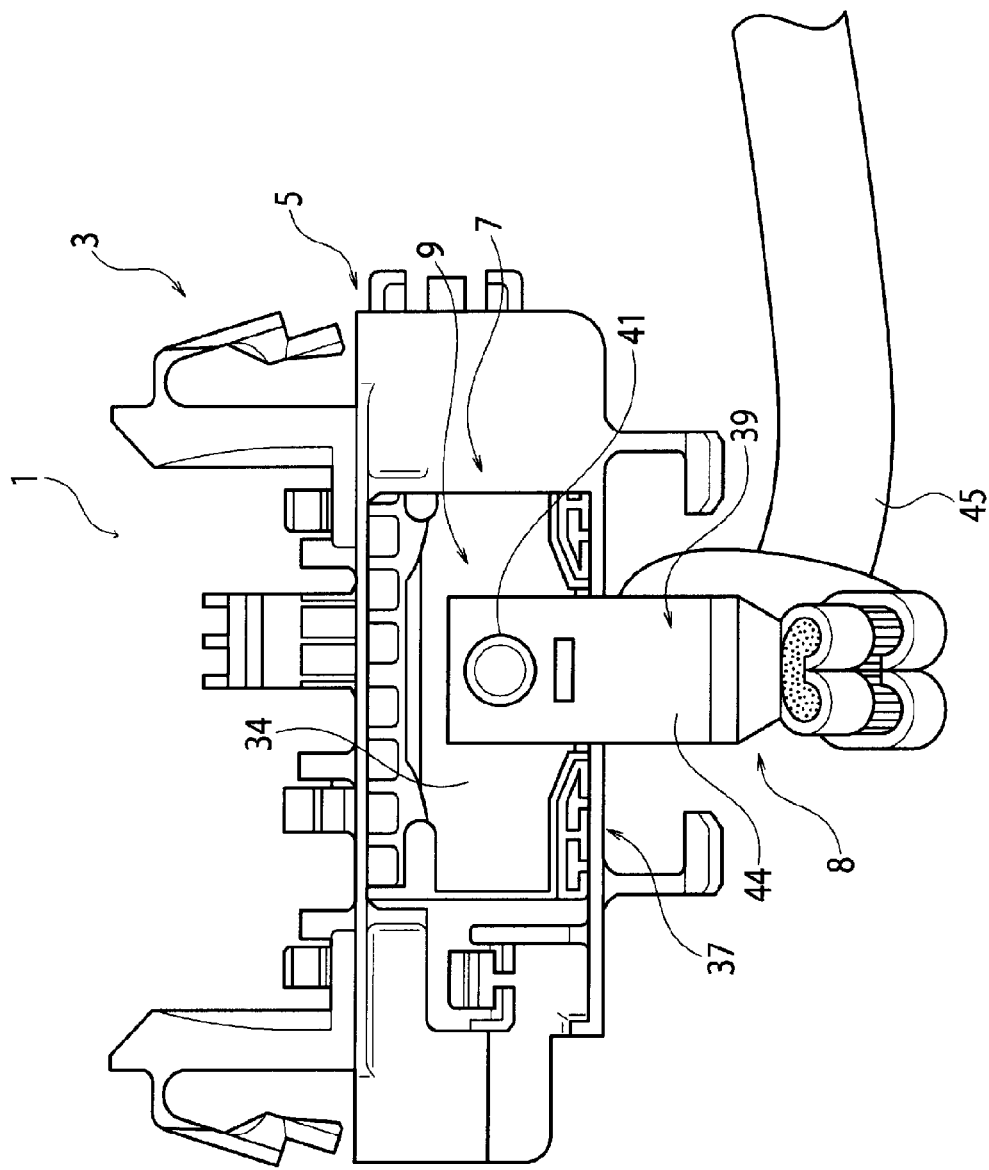
FIG. 12 is a plan view of the assembly structure of the embodiment of the present invention.
Figure 13:
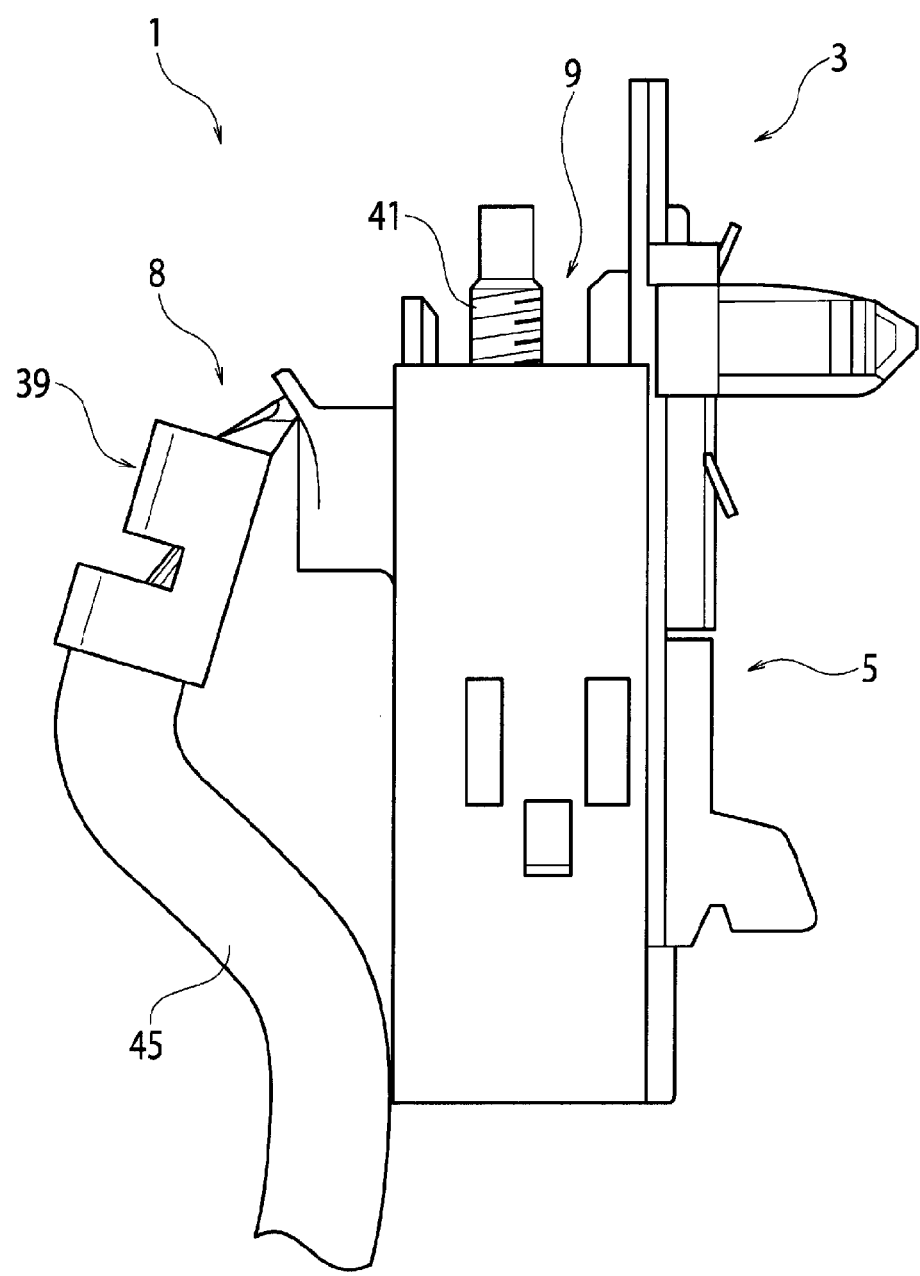
FIG. 13 is a right side view of the assembly structure of the embodiment of the present invention.

The present invention will be hereinbelow described concretely with reference to an illustrated embodiment. FIG. 2 is a perspective view of an insulation case 5 used in an assembly structure 1 of an embodiment of the present invention. FIG. 3 is a front view of the insulation case 5. FIG. 4 is a plan view of the insulation case 5. FIG. 5 is a cross-sectional view of the insulation case taken along a V-V line in FIG. 3. FIG. 6 is a perspective view of an electrical component attachment block 7 used in the assembly structure 1. FIG. 7 is a front view of the electrical component attachment block 7. FIG. 8 is a plan view of the electrical component attachment block 7. FIG. 9 is a right side view of the electrical component attachment block 7. FIG. 10 is a perspective view showing the assembly structure 1 of an electrical junction box 3 of the embodiment of the present invention. FIG. 11 is a front view of the assembly structure. FIG. 12 is a plan view of the assembly structure 1. FIG. 13 is a right side view of the assembly structure.

As shown in FIG. 10 to FIG. 13, an assembly structure 1 of an electrical junction box according to the embodiment of the present invention includes an electrical junction box 3, a connection terminal 8, and a fastener member 9. The electrical junction box 3 includes: an insulation case 5 shown in FIGS. 2 to 5; and an electrical component attachment block 7 shown in FIG. 6 to FIG. 9.

The electrical component attachment block 7 is fitted in the insulation case 5 with the electrical component attachment block 7 housed inside. The entire insulation case 5 is made of an insulating resin. As shown in FIG. 2 to FIG. 5, the insulation case 5 includes: a back face wall portion 11 shaped like a flat plate; side face wall portions 12, 13 integrally bent forward from both of right and left sides of the back face wall portion 11; and a front face wall portion 14 joining front face sides of the side face wall portions 12, 13. A housing 15 for the electrical component attachment block 7 is formed by being surrounded by these wall portions 11, 12, 13, 14. The insulation case 5 is configured to be attached to a car body. Accordingly, multiple attachment hooks 16 for attaching the insulation box 5 to the car body protrude from a rear side of the back face wall portion 11.

The insulation case 5 is capable of protecting the electrical component attachment block 7 from outside by housing the electrical component attachment block 7 inside the housing 15 of the insulation case 5. The housing 15 is provided with: a one-side opening 17 on an upper side; and an opposite-side opening 18 on a lower side. Thereby, the housing 15 is opened upward and downward. The electrical component attachment block 7 is inserted into the housing 15 from the opposite-side opening 18 on the lower side.

Paired right and left tongue-shape contact walls 19, 20 are formed on the one-side opening 17 on the upper side. The paired contact walls 19, 20 are formed in a way that upper ends of the right and left side face wall portions 12, 13 are bent toward and extend over the housing 15. Specifically, the contact walls 19, 20 are formed overhanging from opening edge portions to an opening inner side of the one-side opening 17, whereby the contact walls 19, 20 constitute inner walls of the housing 15. Bent portions 21, 22 which are bent upward are integrally formed on tip end portions of the contact walls 19, 20, respectively. The bent portions 21, 22 are integrated with the back face wall portion 11, whereby rigidity for making the contact wall 19, 20 less likely to deform is imparted to the contact walls 19, 20. The electrical component attachment block 7 housed in the housing 15 comes into contact with the contact walls 19, 20. This contact restrains the electrical component attachment block 7 from coming off upward.

In addition, a terminal receiving portion 23 is formed on the insulation case 5. The terminal receiving portion 23 is formed located substantially at a central portion of an upper part of the front face wall portion 14, and is provided with a receiving surface 24 which is integrally bent forward (in a direction receding from the housing 15) from the upper part of the front face wall portion 14. The connection terminal 8, which will be described later, is placed on the receiving surface 24. A portion above both of right and left sides of the receiving surface 24 on the front face wall portion 14 are formed into a terminal insertion recessed portion 25. The connection terminal 8 is inserted into the housing 15 through this terminal insertion recessed portion 25, and the connection terminal 8 is placed on the receiving surface 24 after this insertion.

As shown in FIG. 6 to FIG. 9, the electrical component attachment block 7 includes a block main body 31 made of an insulating resin, and a conductor bus bar 37 is provided inside the block main body 31. The block main body 31 is formed from: a power source side block unit 32 on an upper part; and a load side block unit 33 on a lower part.

As shown in FIG. 6 to FIG. 8, the power source side block unit 32 is provided with a power source side terminal connection module 34. The power source side terminal connection module 34 is shaped like a flat plate, and is provided on an upper surface of the power source side block unit 32. As shown in FIG. 6 and FIG. 7, multiple partition walls 38 extending in a vertical direction are formed on the load side block unit 33, and load side terminal connection modules 35 are respectively provided inside spaces partitioned by the partition walls 38. A fuse element is formed in each of the load side terminal connection modules 35, and the fuse element has a fuse function of protecting an electrical component by fusing upon a flow of an excessive electrical current.

The conductor bus bar 37 includes the power source side terminal connection module 34 and the load side terminal connection modules 35. A power source side terminal portion 39 is connected to the power source side terminal connection module 34, and load side terminal units (not illustrated) are connected to the load side terminal connection module 35.

A connection bolt 41 is formed on the power source side terminal connection module 34. The connection bolt 41 is installed upright from the power source side terminal connection module 34, and is configured to protrude from the one-side opening 17 of the housing 15 when the electrical component attachment block 7 is housed in the housing 15 of the insulation case 5. Then, a faster nut, which is not illustrated, is screwed onto the connection bolt 41 protruding from the one-side opening 17. The connection bolt 41 and the faster nut, which have been mentioned above, collectively constitute a fastening module 9 for screw-fixing the connection terminal 8, which will be described later, to the conductor bus bar inside the electrical component attachment block 7.

Moreover, contact projecting portions 51 are formed on the block main body 31. The contact projecting portions 51 are formed on an upper part of the block main body 31, that is, in locations respectively corresponding to four corners of an upper part of the power source side terminal connection module 34. To put it specifically, the four contact projecting portions 51 are formed in four locations on the block main body 31 near the four corners of the power source side terminal connection module 34, respectively. The contact projecting portions 51 are configured to inevitably come into contact with the contact walls 19, 20 of the insulation case 5 when the electrical component attachment block 7 is inserted into the housing 15 of the insulation case 5. By this contact, the insertion of the electrical component attachment block 7 into the housing 15 is stopped, and upward detachment of the electrical component attachment block 7 from the housing 15 is prevented at the same time.

As shown in FIG. 10 to FIG. 13, the connection terminal 8 includes a contact plate portion 44, and a power source side wire harness (electrical wires) 45 connected to the contact plate portion 44 by crimping. The contact plate portion 44 is placed on the terminal receiving portion 23 (the receiving surface 24) of the insulation case 5. In this case, the contact plate portion 44 is placed on the receiving surface 24 by being inserted into the housing 15 from the terminal insertion recessed portion 25 on the terminal receiving portion 23. A bolt insertion hole 46 into which to insert the connection bolt 41 is formed in this contact plate portion 44. The connection terminal 8 and the electrical component attachment block 7 are assembled together by inserting the connection bolt 41 into the bolt insertion hole 46. Downward detachment of the electrical component attachment block 7 is prevented by placing the contact plate portion 44 on the receiving surface 24 in this state of assembly.

Next, a procedure of assembling the electrical junction box 3 of this embodiment will be described. The electrical component attachment block 7 is set in a posture in which the connection bolt 41 is situated on the upper side. Keeping the state of this posture, the electrical component attachment block 7 is inserted into the housing 15 from the opposite-side opening 18 on the lower side of the insertion case 5. By this insertion, the two contact projecting portions 51 formed on the upper part of the block main body 31 of the electrical component attachment block 7 are brought into contact with the contact walls 19, 20 of the housing 15. Thereby, the insertion of the electrical component attachment block 7 is stopped. In this case, the contact walls 19, 20 have strength because the bent portions 21, 22 integrated with the back face wall portion 11 are joined to the contact walls 19, 20. For this reason, the contact walls 19, 20 are capable of securely receiving the contact of the contact projecting portion 51 without causing the deforming when the contact is made, and thereby capable of stopping the insertion of the electrical component attachment block 7.

After housing the electrical component attachment block 7 in the housing 15, the contact plate portion 44 of the connection terminal 8 is inserted into the housing 15 from the terminal insertion recessed portion 25 of the insulation case 5, and the connection bolt 41 of the electrical component attachment block 7 is inserted into the bolt insertion hole 46 on the connection terminal 8 (see FIG. 10). By inserting the contact plate portion 44 into the terminal insertion recessed portion 25, both sides of the contact plate portion 44 are supported by the terminal insertion recessed portion 25. As a consequence, the connection terminal 8 is not tilted, and unexpected displacement of the connection terminal 8 is therefore eliminated.

The contact plate portion 44 contacts the receiving surface 24 of the insulation case 5 by inserting the contact plate portion 44 into the terminal insertion recessed portion 25. Keeping this condition, the faster nut is screwed onto the connection bolt 44, whereby the connection terminal 8 is screw-fixed to the conductor bus bar 37 of the electrical component attachment block 7. By this screw-fixation, the electrical component attachment block 7 is held inside the housing 15 of the insulation case 5.

In the above-described assembly structure of the electrical junction box of the embodiment, the electrical component attachment block 7 is fitted into the insulation case 5 by screw-fixing the conductor bus bar 37 in the electrical component attachment block 7 to the connection terminal 8 with the contact projecting portion 51 of the electrical component attachment block 7 put in contact with the contact walls 19, 20 of the insulation case 5 (the housing 15), and with the connection terminal 8 placed on the terminal receiving portion 23 (the receiving surface 24) of the insulation case 5.

This structure restricts: the upward detachment of the electrical component attachment block 7 by putting the contact projecting portion 51 of the electrical component attachment block 7 in contact with the contact walls 19, 20 of the housing 15; and the downward detachment of the electrical component attachment block 7 by placing the connection terminal 8 on the terminal receiving portion 23 of the insulating case 5. This makes it no longer necessary to provide the insulation case 5 and the electrical component attachment block 7 with a lock mechanism for establishing a state of engagement between these constituents. Since, as described above, no lock mechanism is required, molds for forming the insulation case 5 and the electrical component attachment block 7 are prevented from complication. Moreover, since no lock mechanism is required, it is possible to suppress increase in contours and weights of the insulation case 5 and the electrical component attachment block 7.

In addition, this embodiment makes it possible to achieve the assembly and electrical connection of the electrical junction box easily, because the conductor bus bar 37 of the electrical component attachment block 7 is electrically connected to the connection terminal 8 and the electrical component attachment block 7 is simultaneously fitted into the insulation case 5 by inserting the connection bolt 41 installed upright from the electrical component attachment block 7 into the connection terminal 8 and screwing the connection nut onto the connection bolt 41.

Furthermore, in this embodiment, the contact projecting portions 51 are formed in the four locations on the block main body 31 near the four corners of the electrical component attachment block 7, and these contact projecting portions 51 are capable of coming into contact with the contact walls 19, 20 of the insulation case 5. Hence, the contact projecting portions 51 can surely face and contact the contact walls 19, 20 even when the electrical component attachment block 7 is turned over. By this, it is possible to increase latitude in the placement direction of the electrical component attachment block 7 for assembling.

It is to be understood that the present invention is not limited only to the above-described embodiment but various other modifications are possible. For example, in the above-described embodiment, the housing 15 is formed to extend in the vertical direction. Instead, the housing 15 may be formed to extend in the horizontal direction.

REFERENCE SIGNS LIST

1 ASSEMBLY STRUCTURE
3 ELECTRICAL JUNCTION BOX
5 INSULATION CASE
7 ELECTRICAL COMPONENT ATTACHMENT BLOCK
8 CONNECTION TERMINAL
9 FASTENING MODULE
15 HOUSING CHAMBER
17 ONE-SIDE OPENING
18 OPPOSITE-SIDE OPENING
19, 20 CONTACT WALL
23 TERMINAL RECEIVING PORTION
31 BLOCK MAIN BODY
34 POWER SOURCE SIDE TERMINAL CONNECTION MODULE
35 LOAD SIDE TERMINAL CONNECTION MODULE
37 CONDUCTOR BUS BAR
39 POWER SOURCE SIDE TERMINAL PORTION
41 CONNECTION BOLT
44 CONTACT PLATE PORTION
46 BOLT INSERTION HOLE

The invention claimed is:

1. An assembly structure of an electrical junction box including: an electrical junction box having an insulation case and an electrical component attachment block to be fitted into the insulation case; and a connection terminal configured to be fixed to the electrical component attachment block fitted into the insulation case, and to be connected to a conductor bus bar in the electrical component attachment block, comprising:
  a housing provided in the insulation case, and configured to house the electrical component attachment block;
  a contact wall integrally formed on an inner wall of the housing, and configured to come into contact with the housed electrical component attachment block so as to restrain the electrical component attachment block from further being upwardly inserted into the insulation case thereby upward detachment of the electrical component attachment block from the insulation case is restricted;
  a terminal receiving portion provided on the insulation case, and being a portion on which to place the connection terminal; and
  a fastening module configured to screw-fix the connection terminal placed on the terminal receiving portion to the conductor bus bar of the electrical component attachment block housed in the housing, wherein
  the electrical component attachment block is fitted into the insulation case by fixing the connection terminal to the conductor bus bar by use of the fastening module with the electrical component attachment block in contact with the contact wall while downward detachment of the electrical component attachment block is restricted by placing the connection terminal on the terminal receiving portion of the insulation case.

2. The assembly structure of an electrical junction box according to claim 1, wherein
the housing comprises: a one-side opening over part of which the contact wall is formed; and an opposite-side opening through which to insert the electrical component attachment block into the housing,
the fastening module comprises: the connection bolt installed upright from the electrical component attachment block, and configured to protrude from the one-side opening when the electrical component attachment block is housed in the housing; and a faster nut configured to be screwed onto the connection bolt, and
the connection terminal comprises: a contact plate portion to be joined to the conductor bus bar; and a bolt insertion hole provided in the contact plate portion, and being a hole in which to insert the connection bolt.

3. The assembly structure of an electrical junction box according to claim 2, wherein
the electrical component attachment block comprises: a block main body; and the conductive bus bar including a load side terminal connection module, a power source side terminal connection module, a load side terminal portion provided to the load side terminal connection module, and a power source side terminal portion provided to the power source side terminal connection module,
contact projecting portions configured to come in contact with the contact wall are formed in four locations on the block main body near four corners of the power source side terminal connection module, respectively, and
the contact wall is provided overhanging from an opening edge portion to an opening inner side of the one-side opening.

4. The assembly structure of an electrical junction box according to claim 1, further comprising a bent portion which is bent away from the contact wall in the insertion direction of the electrical component attachment block into the housing, wherein
the bent portion has a tip end portion on the contact wall, and
the contact wall and the bent portion are integrated with a back face wall of the electrical junction box.

5. The assembly structure of an electrical junction box according to claim 1, wherein
contact projecting portions are formed in four locations on the electrical component attachment block near four corners of the electrical component attachment block, respectively;
the contact wall comes into contact with the contact projecting portions of the electrical component attachment block, thereby upward detachment of the electrical component attachment block from the insulation case is restricted;
the fastening module is located at a middle portion in a plane configured by the four contact projecting portions; and
when the electrical component attachment block is fitted into the insulation case by fixing the connection terminal to the conductor bus bar by use of the fastening module, the four contact projecting portions of the electrical component attachment block are put in contact with the contact wall, so that the downward detachment of the electrical component attachment block is restricted by placing the connection terminal on the terminal receiving portion of the insulation case.

* * * * *